United States Patent
Kawai (10) Patent No.: US 6,538,197 B1
(45) Date of Patent: Mar. 25, 2003

(54) CONDUCTIVE MEMBER

(75) Inventor: Tsutomu Kawai, Nagoya (JP)

(73) Assignee: Kitigawa Industries Co., Ltd., Nagoya (JP)

( * ) Notice: Subject to any disclaimer, the term of this patent is extended or adjusted under 35 U.S.C. 154(b) by 0 days.

(21) Appl. No.: 10/076,719

(22) Filed: Feb. 13, 2002

(30) Foreign Application Priority Data

Nov. 5, 2001 (JP) .......................................... 2001-339644

(51) Int. Cl.[7] ................................................ H05K 9/00
(52) U.S. Cl. ................................ 174/35 GC; 361/816; 277/920
(58) Field of Search ..................... 439/927; 174/35 R, 174/35 GC; 361/816, 818; 277/920

(56) References Cited

U.S. PATENT DOCUMENTS

| 3,504,095 | A | | 3/1970 | Roberson et al. | |
|---|---|---|---|---|---|
| 5,428,508 | A | * | 6/1995 | Pronto | 361/818 |
| 5,596,487 | A | * | 1/1997 | Castaneda et al. | 361/814 |
| 6,239,973 | B1 | * | 5/2001 | Taylor et al. | 361/704 |
| 6,294,729 | B1 | * | 9/2001 | Kaplo | 174/35 GC |
| 6,359,215 | B1 | * | 3/2002 | Horng | 174/35 GC |
| 6,489,555 | B1 | * | 12/2002 | Horng | 174/35 GC |

* cited by examiner

*Primary Examiner*—Hung V. Ngo
(74) *Attorney, Agent, or Firm*—Davis & Bujold, P.L.L.C.

(57) ABSTRACT

In a conductive member 1, an arm part 21 is bent back from an end of a joint part 11, and a contact part 31 is formed from a portion of the arm part 21, thereby reducing displacement of a contact area between the contact part 31 and a grounding conductor 60 at the time of elastic deformation of the contact part 31. As a result, a desirable grounding condition can be ensured. Also, in such structure, no parts other than the joint part 11 abut on a printed circuit board 50. Consequently, the conductive member 1 can be used on a densely integrated printed circuit board. Furthermore, the contact part 31 is received within a receiving hole of the arm part 21 when elastically deformed. Slippage of the contact part 31 is thus restricted within a predetermined range.

20 Claims, 6 Drawing Sheets

CONDUCTIVE MEMBER

FIELD OF THE INVENTION

The present invention relates to a conductive member to be mounted on the surface of a printed circuit board and pressed against a grounding conductor, thereby allowing electrical conduction between a circuit pattern on the printed circuit board and the grounding conductor.

BACKGROUND OF THE INVENTION

There is a conventionally known technique in which a conductive member is mounted on the surface of a printed circuit board and, in that state, the printed circuit board is fixed in such a manner that the conductive member is pressed against a grounding conductor, such as a chassis or the like, thereby electrically connecting (grounding) a circuit pattern on the printed circuit board to the grounding conductor via the conductive member. Especially, in recent years, more and more instruments having microcomputers built therein have been being manufactured with the development of computer technology. Accordingly, the aforementioned technique is now indispensable for grounding printed circuit boards within such instruments.

Figure 6A:
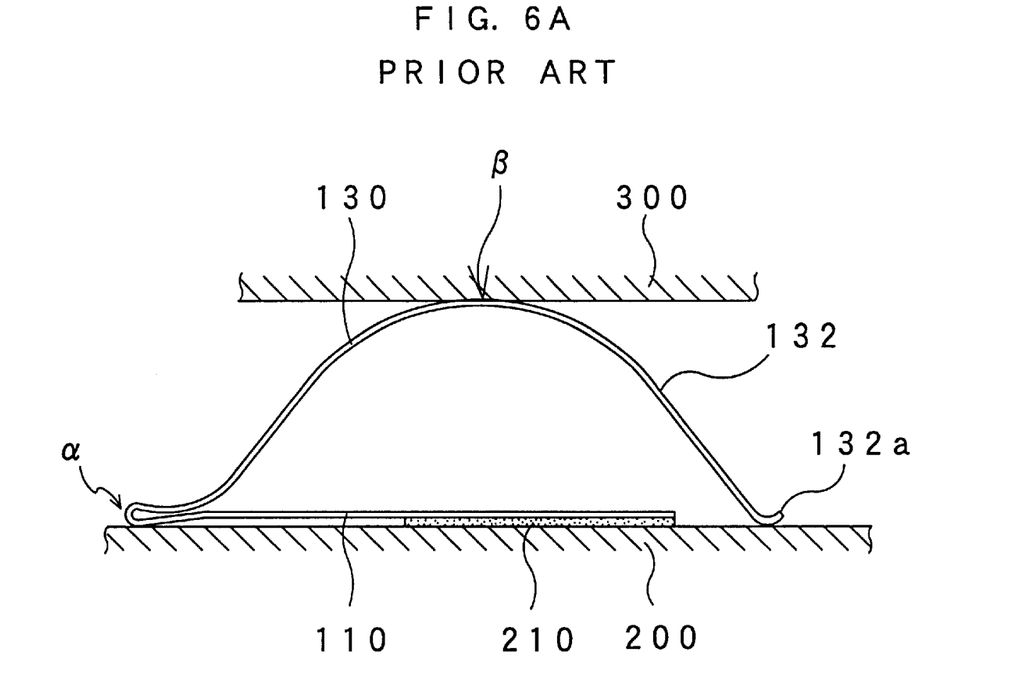
FIGS. 6A and 6B are side views showing a conductive member according to prior art.
Figure 6B:
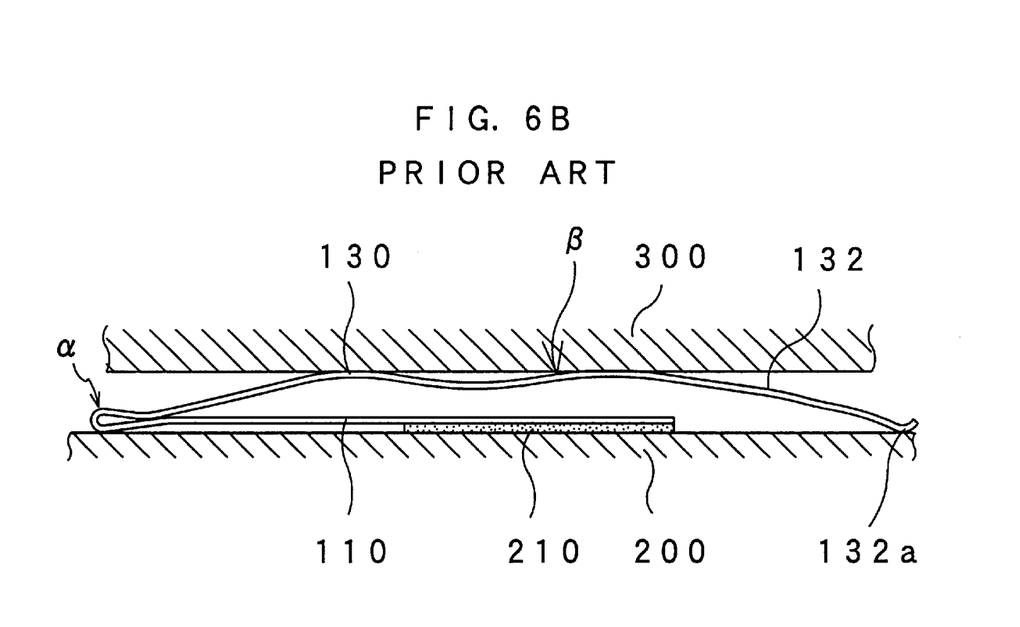

An example of conductive members conventionally known is disclosed in the U.S. Pat. No. 3,504,095, which is illustrated in FIGS. 6A and 6B. As shown in FIG. 6A, this conductive member comprises a joint part 110 to be soldered to a circuit pattern 210 on a printed circuit board 200, a contact part 130 bent back from an end (shown by α) of the joint part 110, and an extended part 132 further extended from the contact part 130 in the direction of the joint part 110.

This conductive member abuts on a grounding conductor 300 and is elastically deformed as shown in FIG. 6B. When the conductive member is elastically deformed, an edge 132*a* of the extended part 132 is moved on the printed circuit board 200 in the right direction. Also, with the elastic deformation of the conductive member, a top area of the contact part 130, which is shown by β in FIG. 6A, is also moved in the right direction, as shown in FIG. 6B.

Because of such structure, in the conductive member as disclosed in the U.S. Pat. No. 3,504,095, the edge 132*a* of the extended part 132 becomes an obstacle, and it is thus impossible to mount other components in the vicinity of the edge 132*a*. As a result, this type of conductive member is not usable on a densely integrated printed circuit board. Also, since a contact area between the grounding conductor 300 and the contact part 130 is relocated with the elastic deformation of the conductive member, it is difficult to maintain a desirable grounding condition. Furthermore, the length of the contact part 130 bent back from the end of the joint part 110 and that of the extended part 132 are too long, which may cause a lateral slippage of the contact part 130 and the extended part 132 when they are compressed.

SUMMARY OF THE INVENTION

The present invention was made to solve the aforementioned problems. More particularly, the object of the invention is to provide a conductive member which can be used on a densely integrated printed circuit board, with which a desirable grounding condition can be ensured, and in which slippage of a contact part can be prevented.

In order to attain the aforementioned object, there is provided a conductive member, made of a conductive and elastic thin sheet metal member, comprising a joint part having a joint surface to be soldered to a circuit pattern on a printed circuit board, an arm part bent back from an end of the joint part in the direction opposite to the joint surface, and a contact part further bent back from a vicinity of an end of the arm part, having a width narrower than that of the arm part, the conductive member being mounted on the printed circuit board for electrical connection between the circuit pattern and a grounding conductor, wherein a receiving hole capable of receiving at least a portion of the contact part is formed in the arm part so as to restrict slippage of the contact part within a predetermined range.

More specifically, in the conductive member of the invention, the arm part is bent back from the end of the joint part, and further, the contact part is bent back from the vicinity of the end of the arm part. Because of this structure, displacement of a contact area between the contact part and the grounding conductor is reduced at the time of elastic deformation of the contact part. As a result, a desirable grounding condition can be ensured. Also, the conductive member of the invention comprises no extended part, unlike the conventional conductive member as mentioned above, and it is thus usable on a densely integrated printed circuit board. Furthermore, since the contact part is received within the receiving hole of the arm part, slippage of the contact part is restricted within a predetermined range, by means of the arm part having a width wider than that of the contact part.

In the foregoing conductive member of the invention, at least a portion of the contact part is received within the receiving hole, thereby restricting slippage of the contact part within a predetermined range. The portion of the contact part may, of course, be received within the receiving hole only when the contact part is elastically deformed. Otherwise, the portion of the contact part may be received within the receiving hole even in a state in which the contact part is not elastically deformed.

In the foregoing conductive member of the invention, at least the contact part abuts on the grounding conductor, thereby elastically deforming the arm part as well as the contact part towards the joint part.

In the foregoing conductive member of the invention, the arm part also abuts on the grounding conductor, together with the contact part, when the arm part and the contact part are elastically deformed. In this case, a proper electrical conduction can be achieved between the grounding conductor and the circuit pattern on the printed circuit board.

The contact part and the receiving hole may be formed by cutting and raising a portion of the arm part. Alternatively, the contact part may be formed as an extension of the arm part and bent back from the end of the arm part.

It is possible to form an entire surface of the joint part as a joint surface. However, it is preferable that the joint part comprises a plurality of joint surfaces. In the case of a plurality of joint surfaces, a so-called self-alignment effect is available. The self-alignment effect is caused by surface tension of the melted solder. More specifically, when a conductive member disposed on the melted solder is out of position, force acts on the conductive member, by means of the surface tension of the melted solder, so as to replace it in position.

It is also preferable that the contact part comprises an attachment surface which can be grasped by a vacuum suction automatic mounting machine, by means of vacuum suction, such that the mounting operation of the conductive member onto the printed circuit board can be performed automatically. Further, in such a case, the attachment surface is preferably displaced, by elastic deformation of the arm part and the contact part, maintaining a substantially parallel relationship relative to the joint surface. In this manner, even if elastic deformation is caused by abutment on a vacuum suction nozzle of the vacuum suction automatic mounting machine, there are few gaps produced between the nozzle and the attachment surface. Consequently, the conductive member can be grasped efficiently, which results in the improvement of efficiency in the automatic mounting operation.

BRIEF DESCRIPTION OF THE DRAWINGS

The present invention will now be described, by way of example, with reference to the accompanying drawings, in which.

DESCRIPTION OF THE PREFERRED EMBODIMENTS

Figure 1:
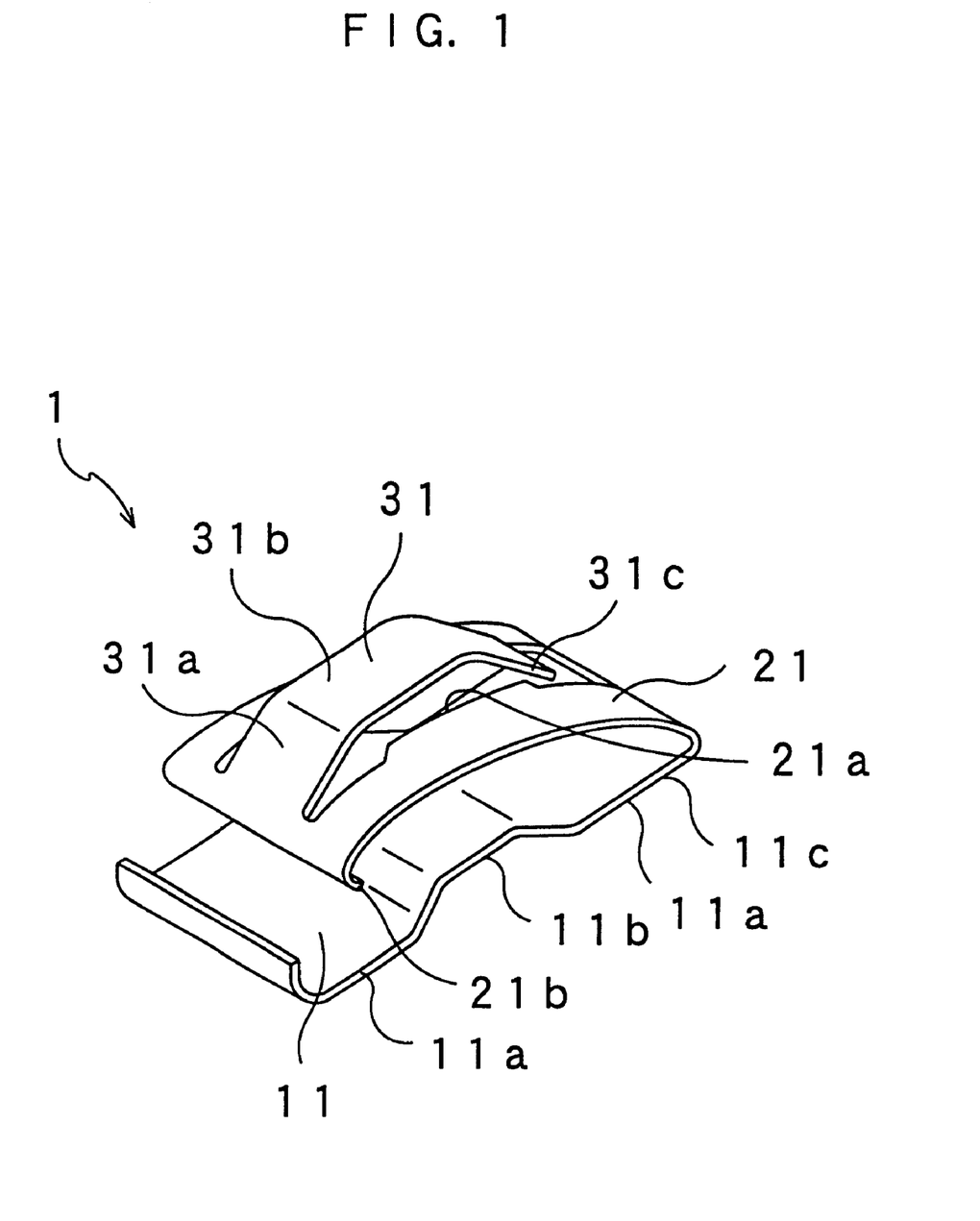
FIG. 1 is an explanatory view showing an entire appearance of a conductive member according to an embodiment of the invention.
Figure 2A:
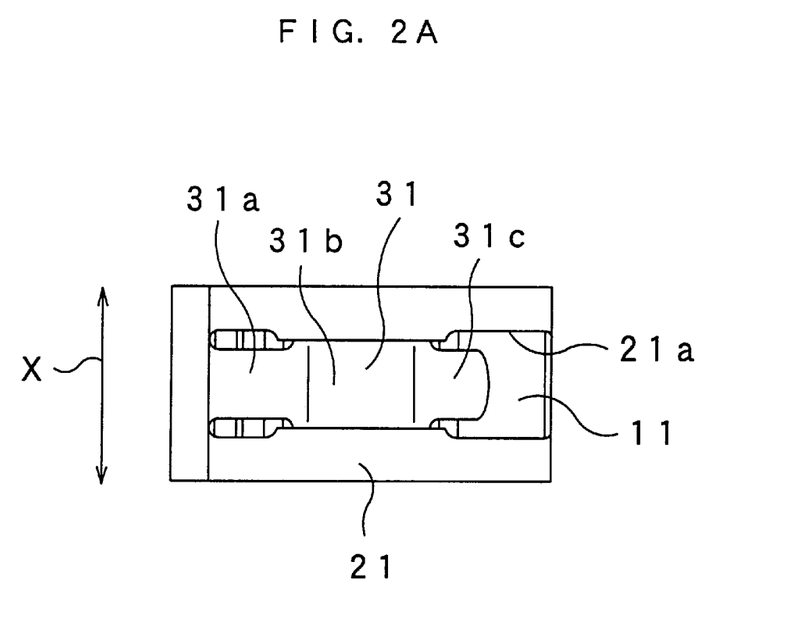
FIG. 2A is a plan view of the conductive member according to the embodiment.
Figure 2B:
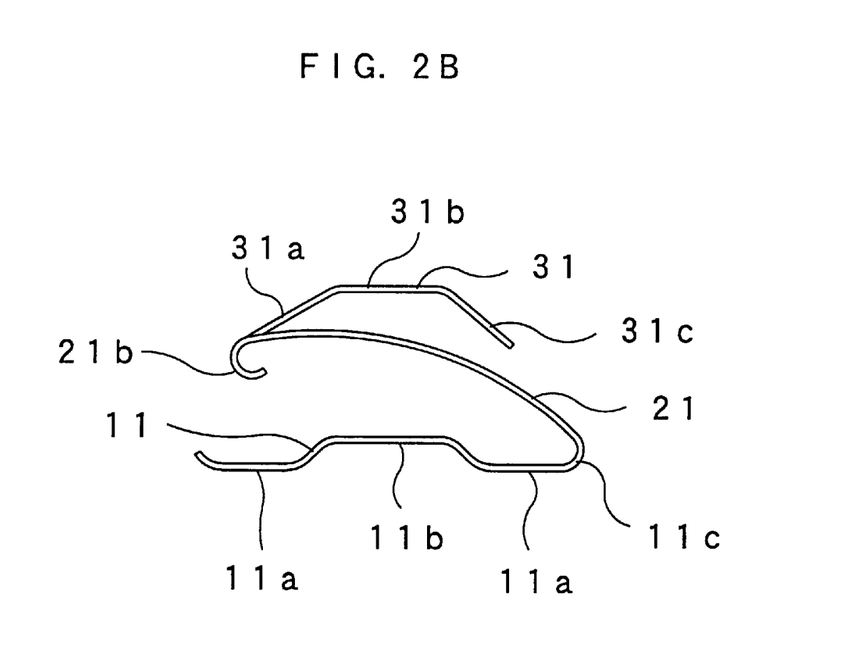
FIG. 2B is a side view thereof.

The structure of a conductive member according to a preferred embodiment of the present invention is shown in FIGS. 1, 2A, and 2B. A conductive member 1 comprises a joint part 11, an arm part 21, and a contact part 31. The joint part 11 is in a substantially rectangular shape, and provided with a concave part 11b on its one side, the concave part 11b being formed in a middle area in the longitudinal direction of the joint part 11. Both side areas in the longitudinal direction of the concave part 11b are joint surfaces 11a, which are to be soldered to a circuit pattern on a printed circuit board.

The arm part 21 is bent back from a longitudinal end 11c of the joint part 11 in the direction opposite to the joint surfaces 11a. The arm part 21 is bent in such a manner that the distance between the arm part 21 and the joint part 11 becomes greater from a bending area of the arm part 21 towards a terminal part thereof, and also in such a manner that the inclination of the arm part 21 relative to the joint part 11 becomes gentler as the arm part 21 approaches its terminal part. An edge 21b of the arm part 21 is bent in the direction of the joint part 11 with a predetermined radius R.

Then, a middle area in the width direction of the arm part 21 (i.e., the direction shown by X in FIG. 2A) is cut and raised to form the contact part 31 having a width approximately one-third of the width of the arm part 21. The contact part 31 comprises a connected part 31a which is connected to the terminal part of the arm part 21 and inclined in a direction away from the joint part 11, a flat part 31b which is bent from the connected part 31a and extended in substantially parallel with the joint part 11, and an end part 31c which is bent from the flat part 31b and inclined in a direction towards the joint part 11. Here, the width of the connected part 31a and that of the end part 31c are made slightly narrower than that of the flat part 31b.

Also, by cutting and raising the middle area of the arm part 21, the arm part 21 is provided with a receiving hole 21a. The width of a middle area in the longitudinal direction of the receiving hole 21a is exactly the same as that of the flat part 31b of the contact part 31, and both side areas of the receiving hole 21a have a width wider than that of the middle area.

Figure 3A:
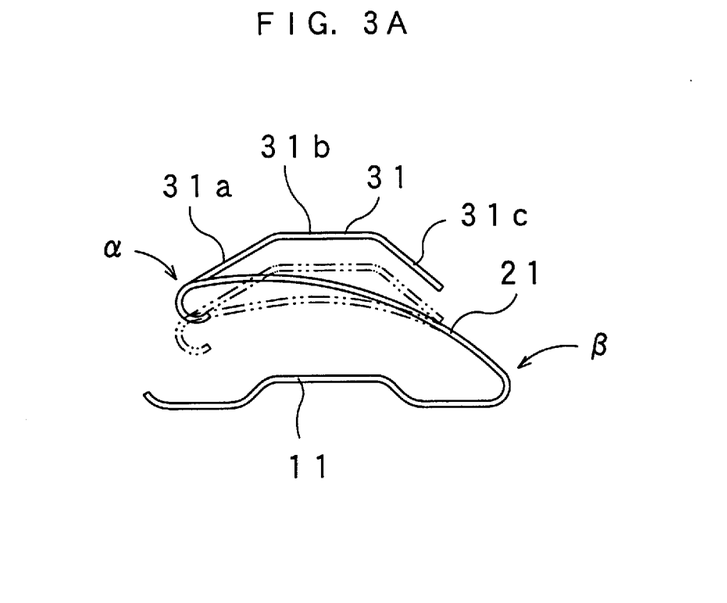
FIGS. 3A and 3B are explanatory views showing functions of the conductive member according to the embodiment.
Figure 3B:
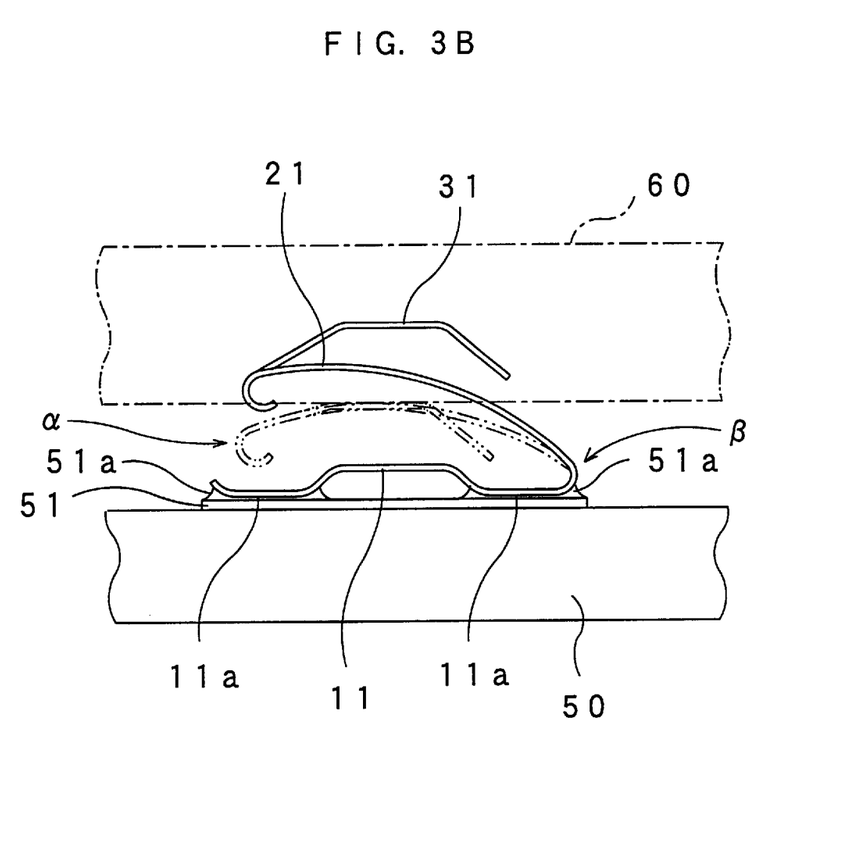

Now, functions of the conductive member 1 having the aforementioned structure are described in view of FIGS. 3A and 3B.

When force is applied from above to the contact part 31 of the conductive member 1, the contact part 31 is elastically deformed towards the joint part 11, around an area in which the contact part 31 is connected to the arm part 21 (i.e., an area shown by a in FIG. 3A). As a result of such elastic deformation, the contact part 31 is received within the receiving hole 21a of the arm part 21. More particularly, when the contact part 31 is elastically deformed to a certain extent, the end part 31c of the contact part 31 is first received within the receiving hole 21a of the arm part 21, as shown by chain double-dashed lines in FIG. 3A.

In a state in which the contact part 31 is received within the receiving hole 21a of the arm part 21, slippage of the contact part 31 in its width direction is restricted.

The conductive member 1 is, as shown in FIG. 3B, mounted on a printed circuit board 50 for use. More specifically, the conductive member 1 is first disposed on the printed circuit board 50 in such a manner that the joint surfaces 11a of the joint part 11 are in contact with solder paste 51a provided on a circuit pattern 51. This process can be automated by means of a vacuum suction automatic mounting machine, by which an attachment surface, that is, the upper surface of the flat part 31b is grasped. Then, the solder paste 51a is melted by reflow soldering, thereby soldering the conductive member 1 to the printed circuit board 50.

The conductive member 1 mounted on the surface of the printed circuit board 50 in the aforementioned manner is pressed against a grounding conductor 60, such as a chassis or the like, by fixing, or the like, of the printed circuit board 50. Because of abutment on the grounding conductor 60, the contact part 31 is elastically deformed around an area in which it is connected to the arm part 21 (i.e., an area shown by a in FIG. 3B), while the arm part 21 is elastically deformed around an area in which it is bent back from the end of the joint part 11 (i.e., an area shown by β in FIG. 3B). At this time, the attachment surface, that is, the upper surface of the flat part 31b is displaced maintaining a substantially parallel relationship relative to the joint surfaces 11a. When the contact part 31 and the arm part 21 are elastically deformed to a sufficient extent, the contact part 31 is received within the receiving hole 21a of the arm part 21, in which state the grounding conductor 60 abuts not only on the contact part 31 but also on the arm part 21. FIG. 3B illustrates, by means of chain double-dashed lines, a state in which the contact part 31 and the arm part 21 are both elastically deformed.

Now, the effect achieved by use of the conductive member 1 according to this embodiment is considered.

In the conductive member 1 according to this embodiment, the contact part 31 is formed from a portion of the arm part 21, which results in a reduced amount of displacement of the contact part 31 in the right or left direction in FIG. 3B at the time of the elastic deformation thereof. In other words, the amount of displacement of a contact area between the contact part 31 and the grounding conductor 60 is small. Consequently, even if vibration or the like is applied, a desirable grounding condition can be ensured. Also, no parts other than the joint surfaces come into contact with the printed circuit board 50 and, therefore, the conductive member 1 can be used on a densely integrated printed circuit board. Furthermore, the contact part 31 is received within the receiving hole 21a of the arm part 21 when elastically deformed, and the contact part 31 is thus prevented from slipping in its width direction.

Figure 4A:
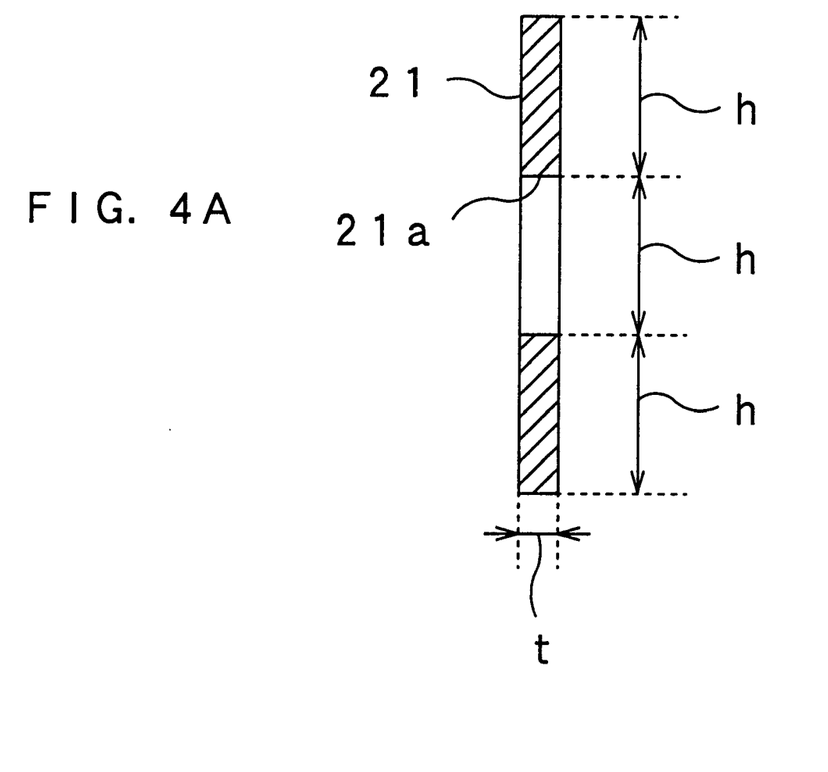
FIGS. 4A and 4B are explanatory views showing cross sections of an arm part and a contact part, respectively, of the conductive member according to the embodiment.
Figure 4B:
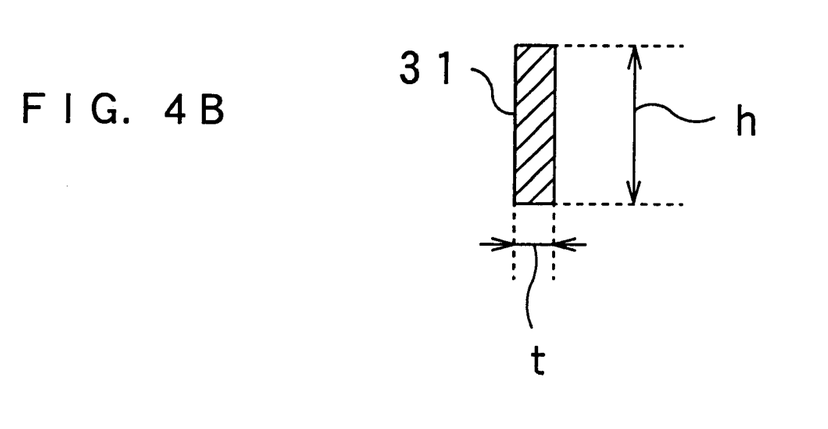

Below, it will be specifically shown that the slippage of the contact part 31 in its width direction is sufficiently restricted by the arm part 21. The arm part 21 has a cut opening, i.e., the receiving hole 21a, in the middle area in its width direction, and a cross section thereof is as shown in FIG. 4A. For better understanding, the width of the receiving hole 21a is determined to be h and the entire width of the arm part 21 to be 3h. On the other hand, a cross section of the contact part 31 is as shown in FIG. 4B. The width of the contact part 31 is determined to be equal to the width h of the receiving hole 21a.

When the thickness of a thin sheet metal member forming the conductive member 1 is determined to be t, a geometrical moment of inertia I1 in the width direction of the arm part 21 is calculated using the following formula 1:

$$I1=(1/12)t\{(3h)^3-h^3\}=26\times(1/12)th^3 \quad \text{[Formula 1]}$$

On the other hand, a geometrical moment of inertia I2 in the width direction of the contact part 31 is calculated using the following formula 2:

$$I2=(1/12)th^3 \quad \text{[Formula 2]}$$

Now, an equation is derived from formulas 1 and 2; that is, I1=26×I2, which proves that the slippage of the contact part 31 in its width direction can be sufficiently restricted by the arm part 21.

Also, in the conductive member 1 according to the embodiment, the arm part 21 as well as the contact part 31 are pressed against the grounding conductor 60, thereby properly grounding the circuit pattern 51 on the printed circuit board 50 to the grounding conductor 60.

Furthermore, in the conductive member 1 according to the embodiment, the middle area in the width direction of the arm part 21 is cut and raised to form the contact part 31 and the receiving hole 21a, which results in a simple structure of the conductive member 1.

In addition, in the conductive member 1 according to the embodiment, the middle area in the longitudinal direction of the joint part 11 is provided with the concave part 11b, and both side areas in the longitudinal direction of the concave part 11b are made as the joint surfaces 11a. Because of this structure, two terminal areas, separated from each other, become surfaces to be bonded and, consequently, a so-called self-alignment effect is available. The self-alignment effect is caused by surface tension of the melted solder. More specifically, when a conductive member disposed on the melted solder is out of position, force acts on the conductive member, by means of the surface tension of the melted solder, so as to replace it in position.

Further in addition, in the conductive member 1 according to the embodiment, since the arm part 21 and the contact part 31 are both elastically deformed, the attachment surface, or the upper surface of the flat part 31b, is displaced downward maintaining a substantially parallel relationship relative to the joint surfaces 11a. Therefore, even if a nozzle of a vacuum suction automatic mounting machine abuts on the attachment surface, thereby causing elastic deformation to the arm part 21 and the contact part 31, there are few gaps produced between the nozzle and the attachment surface. As a result, the grasp of the conductive member can be performed more efficiently, thereby improving efficiency in the automatic mounting operation.

The invention is, of course, not restricted to the embodiment as described above, and may be practiced or embodied in still other ways without departing from the subject matter thereof.

Figure 5A:
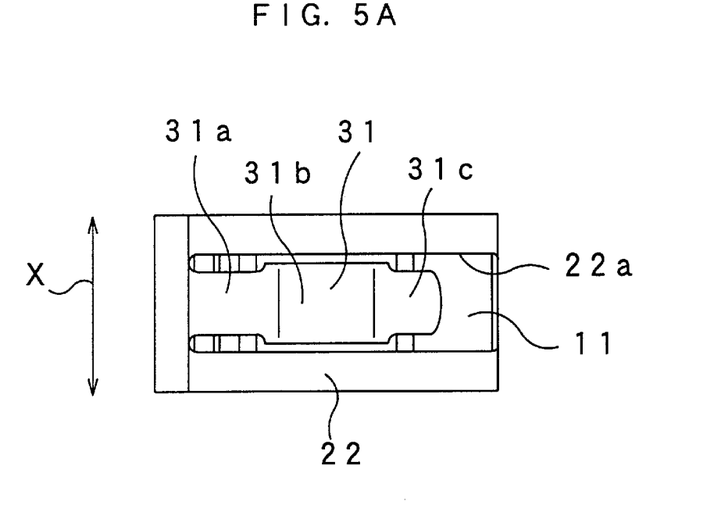
FIGS. 5A, 5B, and 5C are explanatory views showing conductive members according to other embodiments of the invention.

For example, in the above-described embodiment, the middle area in the longitudinal direction of the receiving hole 21a has a width exactly the same as that of the flat part 31b of the contact part 31. Instead of this, as shown in FIG. 5A, an arm part 22 may be provided with a receiving hole 22a having a width wider than that of the flat part 31b of the contact part 31, such that slippage of the contact part 31 can be restricted within a predetermined range.

Figure 5B:
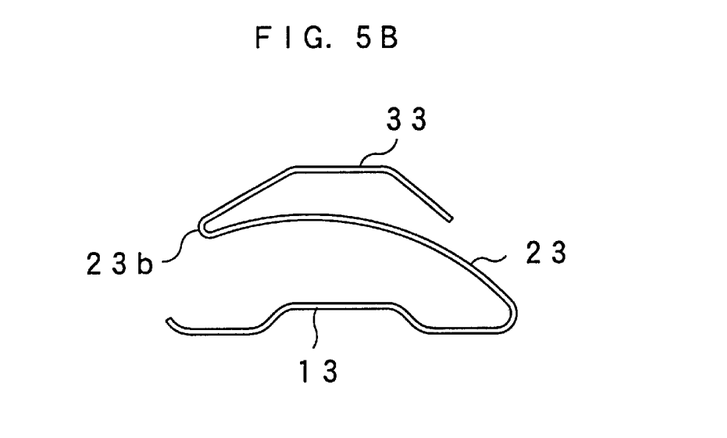
Figure 5C:
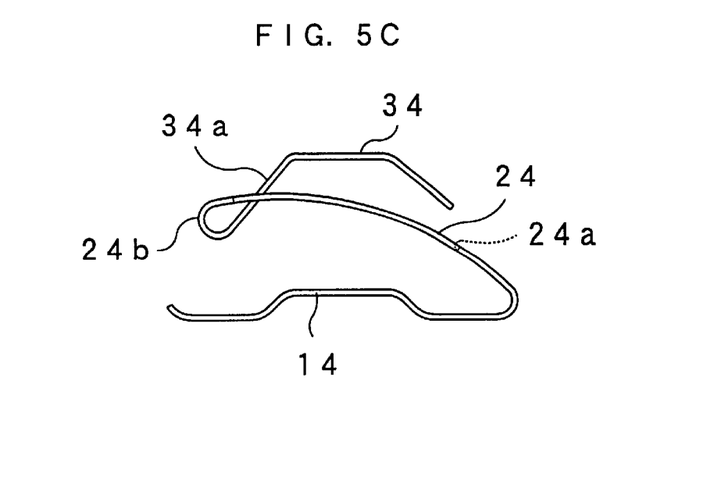

Also, in the above-described embodiment, the contact part 31 is formed by cutting and raising a portion of the arm part 21, however, a contact part may be formed as an extension of the arm part and bent from the terminal part thereof. More particularly, as shown in FIG. 5B, a contact part 33 may be formed by being bent back from an end 23b of an arm part 23 in the direction opposite to a joint part 13. Alternatively, as shown in FIG. 5C, an end 24b of an arm part 24 may be bent in the direction of a joint part 14, thereby forming a contact part 34 having a connected part 34a penetrating through a receiving hole 24a of the arm part 24.

Furthermore, in the above-described embodiment, only when the elastic deformation of the contact part 31 has reached a predetermined extent, the contact part 31 is received within the receiving hole 21a of the arm part 21 (see FIG. 3A). Instead of this, the end part 31c of the contact part 31 may be received within the receiving the 21a of the arm part 21, even in a state in which the contact part 31 is not elastically deformed at all.

Moreover, in the above-described conductive member 1, the concave part 11b is provided in the middle area in the longitudinal direction of the joint part 11, both side areas thereof being formed as the joint surfaces 11a. Instead of this, an entire undersurface of the joint part 11 may be formed as a joint surface.

What is claimed is:

1. An electrically conductive member made from a piece of thin, flexible sheet metal comprising:
   a joint part having a joint surface to be soldered to a circuit pattern on a printed circuit board;
   an arm part bent back from an end of the joint part in a direction opposite to and overlapping the joint surface;
   a contact part further bent back from a vicinity of an end of the arm part, the contact part having a width narrower than that of the arm part;
   the conductive member being mounted on a printed circuit board for electrical connection between a circuit pattern and a grounding conductor; and
   wherein a receiving hole capable of receiving at least a portion of the contact part is formed in the arm part so as to restrict movement of the contact part within a predetermined range.

2. The conductive member according to claim 1, wherein at least the portion of the contact part is received within the receiving hole, thereby restricting slippage of the contact part within the predetermined range.

3. The conductive member according to claim 2, wherein at least the contact part abuts on the grounding conductor, thereby elastically deforming the arm part as well as the contact part towards the joint part.

4. The conductive member according to claim 3, wherein the arm part also abuts on the grounding conductor, together with the contact part, when they are elastically deformed.

5. The conductive member according to claim 4, wherein the contact part and the receiving hole are formed by cutting and raising a portion of the arm part.

6. The conductive member according to claim 4, wherein the contact part is an extension from the arm part and bent back from an end of the arm part.

7. The conductive member according to claim 6, wherein the joint part comprises a plurality of joint surfaces.

8. The conductive member according to claim 7, wherein the contact part comprises an attachment surface which can be grasped by an automatic mounting machine.

9. The conductive member according to claim 8, wherein the attachment surface is displaced, by elastic deformation of the arm part and the contact part, maintaining a substantially parallel relationship relative to the joint surface.

10. A conductive element for connecting an electrical circuit to a ground, the conductive element comprising:
   a contiguous piece of sheet metal defining a compressible spring having at least a spaced apart first bend and a second bend between a first and second ends, the compressible spring further comprising:
      a base portion defining a substantially planar support surface extending in a first direction between the first end and the first bend in the spring;
      an intermediate flex arm contiguous with and spaced from the base portion, the intermediate flex arm extending in a second direction between the first bend and the second bend in the spring;
      a ground contacting flex arm defining a substantially planar contact surface contiguous with and spaced from the intermediate flex arm, the ground contacting flex arm extending substantially in the first direction between the second bend and the second end of the spring;
      a passage formed in the intermediate flex arm and sized to permit passage of at least a portion of the ground contacting flex arm therethrough; and
      wherein the conductive element is sandwiched between and connected to the electrical circuit and the ground, the contact surface of the ground contacting flex arm and the support surface of the base portion remain substantially parallel aligned.

11. The conductive element for grounding an electrical circuit to a ground as set forth in claim 10 wherein the passage is formed having a first and second side enabling substantially vertical movement but preventing lateral movement of the ground contacting flex arm when inserted in the passage.

12. The conductive element for connecting an electrical circuit to a ground as set forth in claim 11 wherein at least the contact surface of the ground contacting flex arm abuts on a surface of the ground which compresses and elastically deforms the intermediate flex arm and the ground contacting flex arm towards the base portion.

13. The conductive element for connecting an electrical circuit to a separate ground as set forth in claim 12 wherein during compression the intermediate flex arm and the ground contacting flex arm abut on the surface of the ground.

14. The conductive element for connecting an electrical circuit to a ground as set forth in claim 13 wherein the ground contacting flex arm is formed from a portion of the intermediate flex arm which is cut and raised to define the passage in the intermediate flex arm.

15. The conductive element for connecting an electrical circuit to a ground as set forth in claim 13 wherein the ground contacting flex arm is formed as an extension of the intermediate flex arm and bent back from an end of the intermediate flex arm to form the second bend.

16. The conductive element for connecting an electrical circuit to a ground as set forth in claim 15 wherein the base portion comprises a plurality of offset planar surfaces.

17. The conductive element for connecting an electrical circuit to a ground as set forth in claim 16 wherein the ground contacting flex arm comprises an attachment surface which can be grasped by an automatic mounting machine.

18. The conductive element for connecting an electrical circuit to a ground as set forth in claim 17 wherein the attachment surface is displaced, by elastic deformation of the intermediate flex arm and the ground contacting flex arm, and maintains a substantially parallel relationship relative to a conductive element support surface.

19. A process of forming a springable conductive element for connecting an electrical circuit to a ground comprising the step of:
   bending a contiguous piece of sheet metal to define a compressible spring having at least a spaced apart first bend and a second bend between a first and second ends, the process of forming the compressible spring further comprising the steps of:
      extending a base portion defining a substantially planar support surface in a first direction between the first end and the first bend in the spring;
      extending an intermediate flex arm contiguous with and spaced from the base portion in a second direction between the first bend and the second bend in the spring;
      extending a ground contacting flex arm defining a substantially planar contact surface contiguous with and spaced from the intermediate flex arm substantially in the first direction between the second bend and the second end of the spring;
      forming a passage in the intermediate flex arm sized to permit passage of at least a portion of the ground contacting flex arm therethrough; and
      sandwiching the conductive element between and connected to the electrical circuit and the ground, and maintaining the contact surface of the ground contacting flex arm and the support surface of the base portion substantially parallel aligned.

20. The process of forming a springable conductive element for connecting an electrical circuit to a ground as set forth in claim 19 further comprising the step of forming the passage having a first and second side enabling substantially vertical movement but preventing lateral movement of the ground contacting flex arm when inserted in the passage.

* * * * *